United States Patent [19]
Lo et al.

[11] Patent Number: 5,635,849
[45] Date of Patent: *Jun. 3, 1997

[54] MINIATURE PROBE POSITIONING ACTUATOR

[75] Inventors: Jiann-Chang Lo; Michael Servedio; James M. Hammond, all of Boca Raton; James E. Boyette, Jr., Delray Beach, all of Fla.; Hans-George H. Kolan, Bowling Green, Ohio

[73] Assignee: International Business Machines Corporation, Armonk, N.Y.

[ * ] Notice: The term of this patent shall not extend beyond the expiration date of Pat. No. 5,532,611.

[21] Appl. No.: 643,523

[22] Filed: May 6, 1996

Related U.S. Application Data

[62] Division of Ser. No. 451,635, May 26, 1995, Pat. No. 5,532,611.

[51] Int. Cl.⁶ .................................................. G01R 31/22
[52] U.S. Cl. .................................... 324/758; 324/754
[58] Field of Search ............................ 324/754, 72.5, 324/72, 758, 158.1, 73.1, 761; 439/482, 824; 310/12, 13; 335/229, 235, 78, 266

[56] References Cited

U.S. PATENT DOCUMENTS

| | | | |
|---|---|---|---|
| 5,072,116 | 12/1991 | Kawade et al. | 324/754 |
| 5,461,324 | 10/1995 | Boyette et al. | 324/73.1 |

Primary Examiner—Vinh P. Nguyen
Attorney, Agent, or Firm—William J. Dick; Richard A. Tomlin; Ronald V. Davidge

[57] ABSTRACT

Disclosed is a Probe Positioning Actuator which is low in cost and mass, capable of high accelerations, relatively long stroke and compact packaging, as well as high in efficiency. The actuator assembly comprises a frame, and at least one pair of spaced apart, laterally extending, conductor carrying, flexible beams attached to the frame. A non-magnetic armature, substantially U-shaped in cross section, is attached adjacent or approximate the extended terminal ends of the beams, and a probe is attached to the base of the "U" of the armature for contacting selected points in the electrical circuit associated with the device being tested. The heart of the actuator includes a coil mounted on the upstanding legs of the U-shaped armature and arranged so that the axis of the coil is perpendicular to the base of the armature but substantially parallel to the probe tip. This arrangement places the 'motor' portion of the actuator adjacent the probe and permits accurate and repeatable, fast control of not only probe tip position but probe tip movement. To complete the motor portion of the actuator, means, carried by the frame create a magnetic field across the coil, whereby upon energization of the coil, deflection of the armature (and thus the beams) occurs, effecting movement of the probe tip into contact with selected portions of the device being tested.

7 Claims, 2 Drawing Sheets

MINIATURE PROBE POSITIONING ACTUATOR

PROBE POSITIONING ACTUATOR

This application is a division of application Ser. No. 08/451,635, filed on May 26, 1995(now U.S. Pat. No. 5,532,611), which is in turn related to a application Ser. No. 08/457,634, also filed on May 26,1995, now abandoned.

BACKGROUND OF THE INVENTION & STATE OF THE PRIOR ART

1. Field of the Invention

The present invention relates to actuators and more particularly relates to highly efficient miniature actuators for use with probes employed in conjunction with electrical circuit testing on miniature devices such as integrated circuit chips, wherein the probe must move in a predetermined, accurate and rapid fashion into engagement with the electrical circuit under accurate and rapid fashion into engagement with the electrical circuit under test.

2. Description of Related Art

New technology has increased the density of very large scale integration electronic circuits (VLSI) which requires a reliable probing machine to perform fast and accurate electrical testing. For example, a single substrate may contain as many as 150,000 test points, and the circuits formed between selected points may require probing for different electrical properties at different stages of the manufacturing process.

One of the crucial components of the probing machine is the probe positioning actuator. The actuator moves the probe tip in a vertical direction (Z-Axis) in order to make contact with the test pads of the circuitry to perform the desired or selected test. As can be imagined from the forgoing, competitive probe positioning actuators should be reliable, have low or no maintenance and if required be easy to maintain, should preferably have low or no wear parts or parts that are subject to fatigue, and should have excellent repeatability of position and capable of moving at high speeds without damage to the substrate (semi-conductor chip) under test.

Machines for probing and testing electrical circuits in integrated circuit chips usually include a stationary base member and an X-Y table mounted thereon for movement relative to the base member. A fixture or jig is conventionally provided attached to the table, the fixture being employed to accurately hold, position and vertically elevate the chip into contact with one or more probes for chip monitoring and test. In this arrangement the probes are fixedly connected to the base member, or if monitoring (testing) of the chip is to occur on opposite sides thereof simultaneously, other jig and fixture means are provided for swinging the testing probes into position. Because of the mass of the fixture or jig, (as compared with the mass of the probes), chip movement into engagement with the probe(s) is slow. Moreover, with fixed probes, it is extremely difficult to adjust the probe tips to ensure approximate uniformity of pressure when the chip engages the probes. Various means have been provided in an attempt to ensure substantially uniform probing force. These include planarization of both the probe tips and/or the surface of the chip under test.

Other ways, such as pre-loading the probe arms, ensuring a constant deflection distance of the probe arms etc. have been partially successful but have resulted in differences when the chip surface is uneven, or the probe tip subscribes an arc when the chip comes into contact with the probe or probes effecting scratching of the chip surface resulting in damage to the delicate electrical circuits therein. In other instances, uncontrolled or poorly controlled probe tip forces on the chip surface can result in damage to either or both of the chip surface and probe tip.

Other methods of control of the probe arm is to provide an actuator for each of the probes and move the chip under test only in the X-Y plane. Some of the actuators employed include that shown in U.S. Pat. No. 5,153,472. While this probe actuator overcomes the problems of non linear probe movement in the Z-axis, and meets the requirements of controllable probe force, it suffers from two major defects: (1) the ball bearing structure is subject to wear and stress concentration, resulting in non-repetitive or repeatable accurate alignment of the probe tip over a period of time, and (2) the high mass of the tip armature structure makes probe tip control difficult unless probe movement is deliberately made slow so as to prevent inadvertent high impact loads on the chip. Other actuator designs have included air bearings for their movement. However, air bearings are not stable at high speeds because of turbulent flow.

Other problems relating to electrical signal interference when measuring with the probe tip, using electrically powered actuators, are overcome as shown in U.S. Pat. No. 4,123,706 by the use of fluid actuation. However, it is believed that the twin beam actuator shown in the '706 patent has damping problems with fast probing contacts moving at high speeds. Moreover, despite the characterization of "no arc" movement of the probe, it is believed that the probe tip of the '706 patent has to move in some arc which creates some difficulty in initial positioning of the actuator/probe tip, especially when the chip surface is uneven, or the alignment of chip surface and probe tip is not perfect. Also, because the principal actuation is in one direction or uni-sided, probe bounce may occur at high testing speeds and force.

SUMMARY OF THE INVENTION

In view of the above, it is a principal object of the present invention to provide an improved, more efficient, actuator/probe assembly for testing electrical circuits and the like on devices such as semi-conductor chips.

A further object of the present invention is to provide a low mass, high speed actuator for a probe which inherently is capable of substantially perpendicular movement of both the coil and the probe tip with respect to the chip surface to inhibit probe scrubbing of the delicate surface of the chip under test.

Another object of the present invention is to provide a low mass, high speed actuator for semi-conductor chip testing in which there are relatively no wearing parts so that the life of the actuator in use is substantially indefinite under normal usage conditions.

Yet another object of the present invention is to provide an actuator for a probe for semi-conductor chip testing in which the structure is such that power and signal leads may be carried in the same cabling incorporated into the beam structure.

In the illustrated Instance, the forgoing is accomplished by providing an actuator for accurately and selectively positioning a probe into electrical contact with an electrical circuit associated with a device and for testing the same. The actuator is adapted for receipt adjacent to an X-Y positioning apparatus. The actuator is located in a plane parallel to the plane of the device with the circuit being tested so that it is positioned In overlapping relation to the device being tested. The device In turn Is held in a predetermined position on the X-Y positioning apparatus by any conventional means such as a jig or fixture. Tile actuator assembly comprises a frame, and at least one pair of spaced apart, laterally extending, conductor carrying, flexible cantilevered beams attached at one end to the frame. A non-magnetic armature, substantially U-shaped if cross section, is attached adjacent or approximate the extended free terminal ends of the beams, and a probe is attached to the base of the "U" shape of the armature for contacting selected points in the electrical circuit associated with the device being tested. The heart of the actuator includes a coil arranged so that Its axis Is perpendicular to the base of the U-shaped armature and mounted on the upstanding legs thereof. This places the 'motor' portion of the actuator adjacent the probe and as will be discussed hereinafter, permits accurate and repeatable, fast control of not only probe tip position but probe tip movement. To complete the motor portion of the actuator, means, carried by the frame create a magnetic field across at least part of the coil, whereby upon energization of the coil, deflection of the armature (and thus the beams) occurs, effecting movement of the probe into contact with selected portions of the electrical circuit associated with the device being tested. The magnetic field is created, in the present instance, by a pair of permanent magnets mounted on interior portions of a pair of U-shaped iron cores, the cores being adapted to embrace, but in spaced apart relation, opposite legs of the U-shaped armature upon which the coil is sound. In this manner, the magnets confront opposite sides of the coil. Because of the iron core, the efficiency of the system is enhanced. The price, however, as compared to the co-pending application identified above, is that the weight and size of the actuator is increased.

The iron cores are in turn attached to the frame with their leg portions parallel to the axis of the coil and on opposite sides thereof, the magnets being magnetically oriented so that the sides thereof facing the coils are of the same polarity, while the spaced apart leg of each of the cores is of the opposite polarity, thereby creating, in conjunction with their associated iron core leg, the desired magnetic field across the coil. Moreover, with this structure, the electromagnetic force applied to both sides of the coil is substantially uniform or evenly distributed, increasing the efficiency of the actuator.

Other features of the actuator include at least one of the flexible beams being composed of a flexible circuit material carrying at least some electrical conductors for at least one of the probe and coil.

Another feature of the actuator of the present invention is the inclusion of sensor means associated with the probe for indicating at least probe deflection when the coils are energized.

Other objects and a more complete understanding of the invention may be had by referring to the following description taken in conjunction with the accompanying drawings in which:

DESCRIPTION OF THE ILLUSTRATIVE EMBODIMENT

Figure 1:
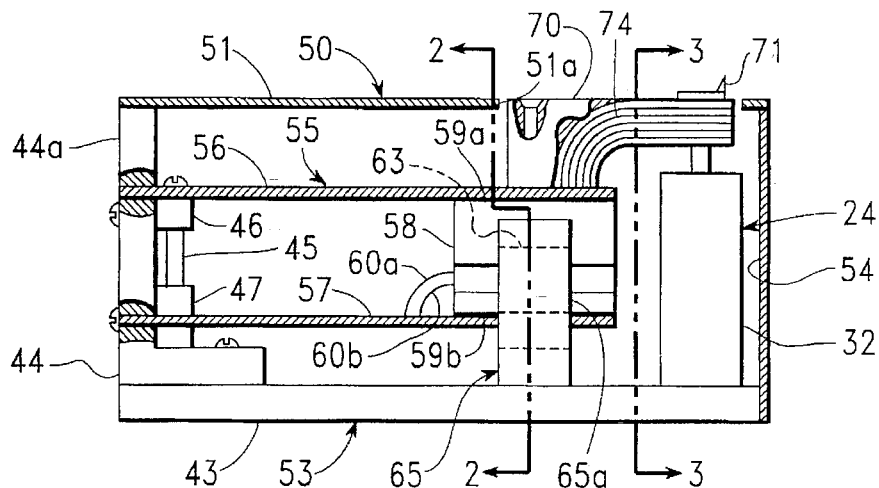
FIG. 1 is an enlarged, fragmentary, side elevational view of an actuator constructed in accordance with the present invention with the cover in place.
Figure 2:
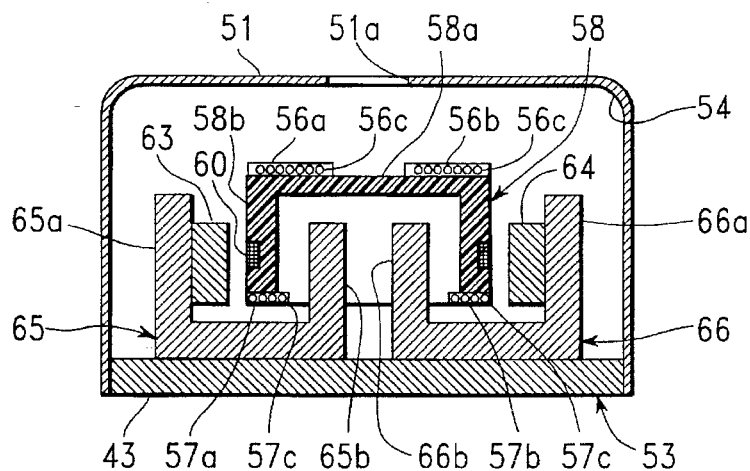
FIG. 2 is an enlarged fragmentary sectional view taken along line 2—2 of FIG. 1 and with certain parts removed to aid the readers understanding.

Turning now to the drawings and especially FIGS. 1 & 2 thereof, an actuator 50, constructed in accordance with the present invention, is shown therein.

Figure 5:
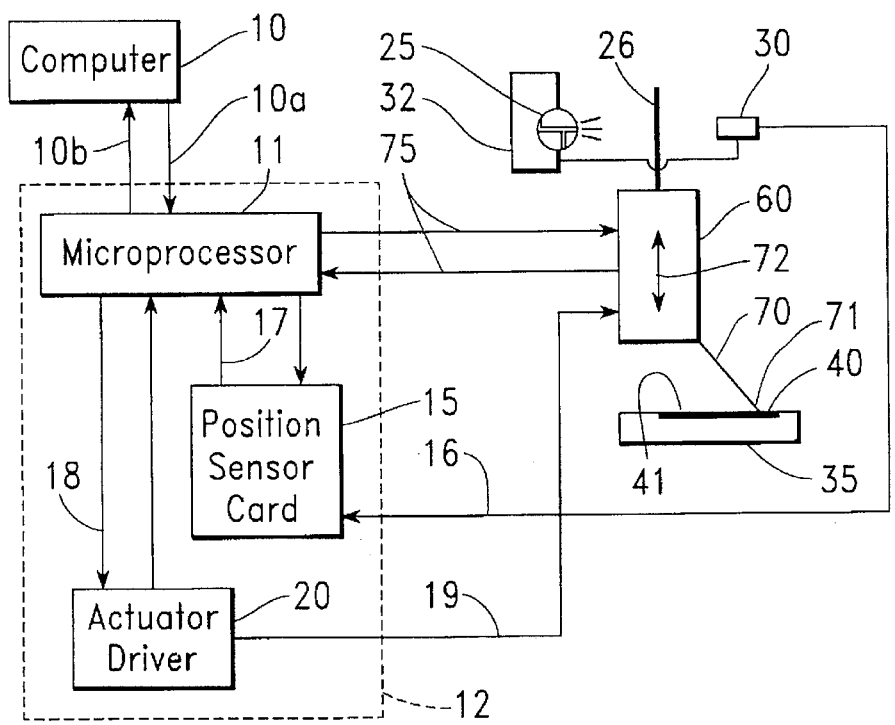
FIG. 5 is a schematic representation of an exemplary probe system incorporating the actuator mechanism of the present invention, and.;-FIG.

From a system standpoint, and as shall be more fully explained hereinafter, as illustrated best in FIG. 5, the actuator 50 includes a probe 70, the tip 71 of which is adapted to engage circuits or pads therefor and the like on the surface 41 of a work piece, for example a device such as a semiconductor chip 40. The device or chip 40 is held, in a conventional manner, by a jig or fixture (not shown) onto an X-Y table 35. The actuator is also adapted for receipt onto a jig or fixture independently mounted but associated with the X-Y table 35 for precisely locating the actuator 50 in a plane parallel to the plane of the device with the circuit being tested. In this manner, the probe tip of the actuator is positioned in superimposed, overlapping relation to the device 40 being tested. The motion of the actuator 50 to effect engagement of the tip 71 of the probe 70 against the surface 41 of the device or chip 40 includes a computer 10, which receives a control card 12 for operation with the computer 10, and a probe position sensor 30. The system and its operation will be explained more fully hereinafter. Suffice at this point in the description to note that the actuator 50 serves to move the probe 70 in the direction of,the arrow 72 into and out of engagement with the surface 41 of the device 40 under test. It should also be noted that the probe and actuator are position independent. This means that the actuator 50 and thus the probe 70 may be employed in the fashion illustrated in FIG. 5, i.e. above the device being tested, or positioned below the device being tested with the probe tip 71 projecting upwardly so as to contact the underside of the device being tested. The latter position is shown in FIG. 1.

Turning now to FIG. 1, the actuator 50 includes a cover portion 51 which serves as a protection for the internal conductors and partially for the motor structure, hereinafter described. The cover portion 51 is connected to a light weight actuator support member 53 which serves, in the present instance, as a frame, a separator for parts of the actuator mechanism, and a cover therefor. It should be recognized that the frame 53 in conjunction with the cover 51 forms a cavity 54 for receipt of the probe motor and probing mechanism 55 of the actuator 50. The frame 53 includes a platform base 43 connected to an upstanding L-shaped angle 44, the upstanding leg portion 44a thereof serving to close the rear of the cavity 54, acting as a support for the cover 51, and as will appear hereinafter, cooperating in conjunction with post 45, and clamps 46, 47 to serve as attachments for flexible circuit beams 56 and 57.

In accordance with one feature of the invention, the probe motor and probing mechanism 55 of the actuator 50 comprises at least a pair of spaced apart, laterally extending, resilient and flexible cantilevered beams 56, 57, each of which, in the illustrated instance, are bifurcated to form beam legs 56a, 56b and 57a, 57b respectively. (See FIGS. 1

& 2). As shown best in FIG. 1, the extended free ends of the beams 56 and 57 are connected to (by bonding or the like) a U-shaped armature 58, composed preferably of a non-magnetic, light weight-material such as Uttem® (a trademark of General Electric Corp.), a polyetherimide resin (1000 series resin). At the upper portion, or base 58a of the "U" of the armature 58 is connected the probe 70, which projects through an aperture 51a in the cover 51. The probe 70 includes a probe tip 71, adapted to engage selected circuits and the like on the surface 41 of a device such as the semiconductor chip 40 illustrated schematically in FIG. 5.

The beams 56 and 57 are preferably formed of a polyimide and copper flex cable such as Kapton® (a Registered Trademark of El. DuPont Corp.) and sold by E.I. Dupont Corp. As shown best in FIG. 2, the beams 56 and 57 include a plurality of conductors 56c and 57c respectively. The beams may terminate in any desired construction. For example, as shown in FIG. 1, they may pass through the leg 44a of the angle 44 so that external connections may be made to power sources, and as will be more completely described with regard to FIGS. 5 & 6, connection to the control card 12 associated with computer 10.

As shown in FIG. 1, the beams 56 and 57 are bonded as at 59a and 59b to the armature 58. The heart of the actuator includes a coil 60 wound on the upstanding legs 58b and 58c of the U-shaped armature and arranged so that its axis is perpendicular to the base 58a of the armature. This places the 'motor' portion of the actuator adjacent the probe 70 and as will be discussed hereinafter, permits accurate and repeatable, fast control of not only probe tip 71 position but probe tip movement.

To complete the motor portion of the actuator, means, carried by the frame 53 create a magnetic field across at least part of the coil 60, and for increased efficiency in the present instance across the whole peripheral extent of the Coil. In this manner, upon energization of the coil, deflection of the armature 58 (and thus the beams 56 and 57) occurs, effecting movement of the probe tip 71 into contact with selected portions of the electrical circuit associated with the device being tested. The magnetic field is created, in the present instance, by a pair of permanent magnets 63, 64 mounted on the interiors of leg portions 65a, 66a of a pair of U-shaped iron cores 65, 66 respectively. The cores 65, 66 have interior leg portions 65b, 66b respectively which are adapted to embrace in spaced apart relation, in conjunction with their exterior leg portions 65a, 66b, opposite legs 58b, 58c of the U-shaped armature 58 so that the magnets 63 & 64 confront opposite sides of the coil 60. Because of the iron core and the fact that a predetermined portion of the coil 60 is always in the magnetic field, the efficiency of the system is enhanced. This is because with this structure, the electromagnetic force applied to both sides of the coil is substantially uniform or evenly distributed, increasing the efficiency of the actuator. The price, however, as compared to the co-pending application identified above, is that the weight and size of the actuator 50 is increased.

As may be appreciated by one skilled in the art, the iron cores 65, 66 may be joined as at the legs 65b, 66b. Regardless of the structure, i.e. whether the cores are separate or connected, they should be attached to the frame 53 with their leg portions 65a, 65b, 66a, 66b substantially parallel to the axis of the coil and on opposite sides thereof, the magnets 63, 64 being magnetically oriented so that the sides thereof facing the coil 60 are of the same polarity, while the spaced apart legs of each of the cores 65, 66 is of the opposite polarity, thereby creating, in conjunction with their associated legs, the desired magnetic field across the coil 60. The coil 60 preferably has its' terminal leads, 60a, 60b joined to current carrying conductors, 57c of beam 57. (FIG. 1 )

Figures 3, 4:
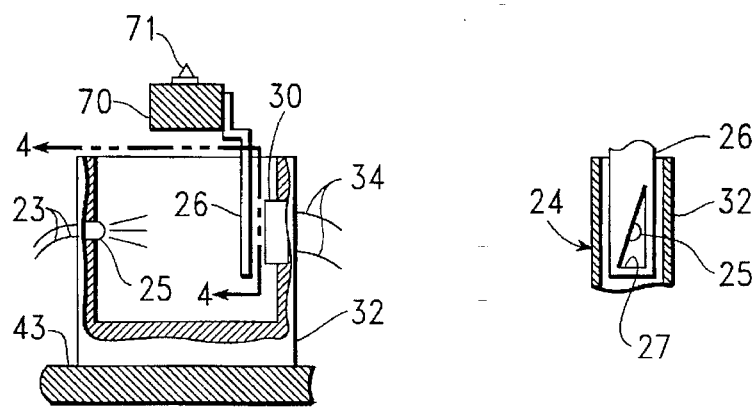
FIG. 3 is an enlarged, fragmentary sectional view taken along line 3—3 of FIG. 1, and illustrating a sensor which may be employed to indicate deflection of the probe caused by the actuator of the present invention.
FIG. 4 is an enlarged, fragmentary, frontal elevational view taken along lines 4—4 of FIG. 3.

It will be recognized to one skilled in the art, it is preferred that the exact position of the probe tip 71, relative to the semi-conductor chip 40, be known so that the correct Amount of current can be supplied to the coil 60. To this end, a position sensing apparatus 24 may be attached to the base 43 of the frame 53 in such a manner to detect the armature 58 position under varying current created deflection conditions and controlled in a manner by suitable feedback to permit raising or lowering, in response to armature position, the current applied to the coil 60. As shown schematically in FIGS. 3 & 4, the position sensing apparatus 24 comprises a light source 25, such as an infra red emitting diode, which is located on one side of a flag or tell-tale 26 which in turn is attached to the armature 58 so that as the armature is elevated or depressed in response to the current applied to the coil 60, a greater or lesser amount of light will be detected from the light source 25 by the sensor 30. The amount of light sensed by the detector or sensor 30 may be varied by the flag or tell-tale 26 having a shaped opening therethrough, for example the opening 27 being in the shape of a triangle such as illustrated in FIG. 4, so that as the armature 58 descends less light will be detected by the sensor ( in the illustrated instance a photo-diode sensor) 30, and when it ascends, more light will be detected. (The arrangement may also be the opposite, merely depending upon the way in which the user decides to set the sensor output, i.e. more light higher or diminished output).

Figure 6:
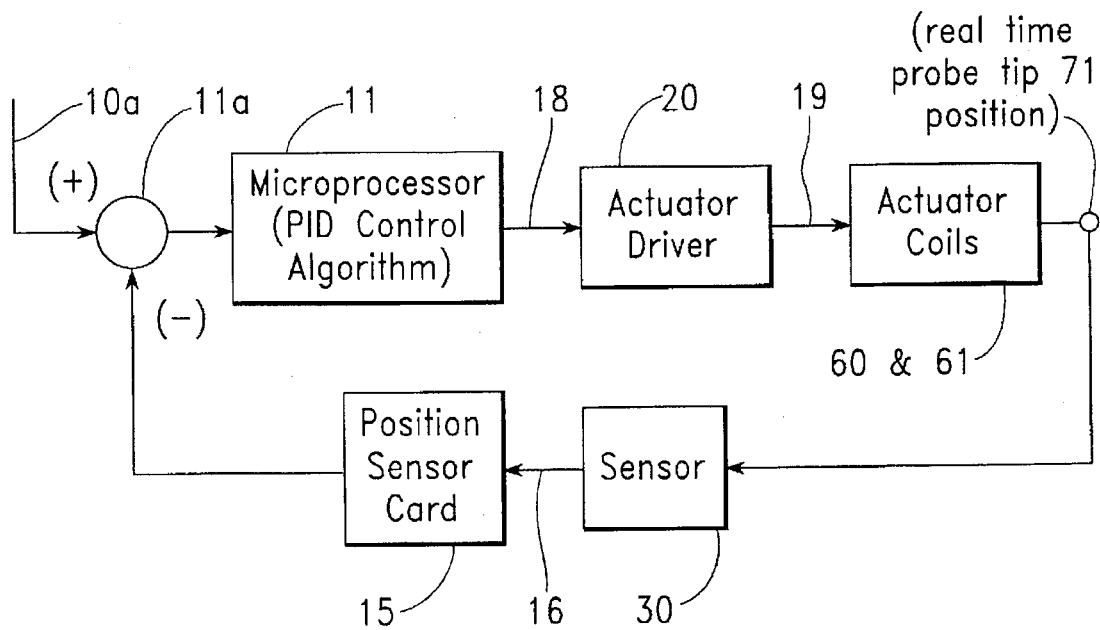
FIG. 6 is a schematic or block diagram representation of the controller for energization of the 'motor' portion of the actuator of the present invention.

As shown best in FIG 1 & 2, the sensor 30 may be covered by a simple receptacle like cover 32 mounted on the base 43 of frame 53. As the flag 26 is attached to the probe 70 (see FIG.3) it is adapted to be raised and lowered as the armature 58 reciprocates in the direction of arrow 72 (FIG.5). Moreover, as best shown in FIGS.3 & 6, the sensor 30 and light 25 may be carried by the receptacle/cover 32 and electrically connected, as shown schematically in FIG. 3 to a current carrying wire pair 23 and 34 and then, if desired, into conductors in one of the flexible beams 56, 57. The output of the sensor 30 may be applied through wire pair 34 to the flexible beam 57, and as shown schematically in FIG. 6, applied to a control card 12, carried by a computer 10, e.g. as through lead 16.

The computer 10 is preferably of the type that can accommodate plug in boards or cards which include local or board carrying micro-processors. The IBM micro-channel architecture machines, sold under the trade name PS/2®, are ideal for this kind of activity. The micro-channel architecture machines are capable of bus-mastering (wherein the microprocessor on the board communicates with the computer's CPU, controls its own local bus and function, and is capable of other interrelated as well as other independent actions). In this connection, the control card 12 preferably includes a position sensor card 15 and an actuator driver card 20, all under control of a local microprocessor 11. The microprocessor 11 may be any convenient one readily available on the open market, for example a Texas Instrument TMS320C30. The position sensor card 15 receives a sense signal from the sensor 30 (FIG. 6) over line 16, which, after suitable modification is in turn fed back to the microprocessor 11 by line 17 for processing (e.g. required sense, amplification, etc.), as will be explained hereinafter with respect to FIG. 6. Suffice at this juncture, that the processor 11 outputs a signal over line 18 to actuator driver 20 which is applied through conductor 19 to the motor coil 60. The actuator driver 20 is in actuality a current amplifier of suitable output sufficient to effect the necessary current flow to move the armature 58 and thus the probe 70 into proper position.

The system may employ any of a number of standard control algorithms for the actuator motor control. Proportional Integral Derivative (PID) control algorithms are well known in the industry and may be employed for suitable feedback control. As shown in FIG. 6, the microprocessor 11 may contain the PID control algorithm. Examples of the PID algorithm are set forth in the book "Feedback Control System" by Charles L. Phillips and Royce D. Harbor, Prentice Hall, 1988, pages 239 et. seq. The computer 10 provides a suitable machine initialization signal over line 10a(FIGS. 5 & 6) and tells the microprocessor 11, inter alia, what measurements to perform, e.g. resistance, capacitance, where the pad on chip is located, and how much deflection is required of the armature 58 to effect probe 71 contact with the surface 41 of device or chip 40. The microprocessor 11, may, for example, put out a positive (+) signal over line 10a to a summing junction or amplifier 11a, associated with the microprocessor 11, to which the feedback signal from the sensor 30 and position sensor card 15 outputs a negative (−) signal. This means that an error signal is applied to the microprocessor 11, which error signal is appropriately handled by the PID control algorithm contained in the microprocessor.

Because the microprocessor 11 may operate substantially independently of the computer 10 CPU while operating in a dedicated mode, it is preferable that the instructions sent by the computer 10 relating to the probe measurements, settings, and the like be handled by the microprocessor 11. As illustrated, the computer provides this necessary initial information to the microprocessor 11 over line 10b while receiving any feedback data or information over line 10b. These signals, including measurements, to and from the probe 70, are carried by selected conductors 56c in the upper beam 56, through connecting wires 74 (FIG. 1) to the probe 70, and through wire pair 75 (FIG. 5) to and from the microprocessor 11.

From the forgoing, it should be recognized that the structure provided by the probe actuation scheme of the present invention allows for small structures, which because of its' low mass, increased motor efficiency and the ability to place the structures in close situations, permits of faster acting and more reliable probing of devices under test.

Although the invention has been described with a certain degree of particularity, it should be recognized that elements thereof may be altered by person(s) skilled in the art without departing from the spirit and scope of the invention as hereinafter set forth in the following claims.

What is claimed is:

1. An actuator for accurately and selectively positioning a probe into electrical contact with an electrical circuit associated with a device and for testing the same, said actuator comprising in combination:

a frame;

at least one pair of spaced apart, laterally extending, flexible beams, with each of said beams having an attachment end attached to said frame and a free end opposite said attachment end;

an armature attached to said free end of each of said beams;

a probe attached to the armature and having a probe tip thereon for contacting selected points of an electrical circuit associated with a device being tested;

a coil attached to said armature; and a structure composed of magnetic material including a first permanent magnet, attached to said frame, directing a magnetic field from said permanent magnet across a portion of said coil, so that, when electrical current is driven through said coil, said magnetic field causes movement of said armature and said probe with deflection of said flexible beams.

2. An actuator for accurately and selectively positioning a probe into electrical contact with an electrical circuit in accordance with claim 1 wherein said armature is composed of a substantially non-magnetic material and said coil connected to said armature is wound on said armature.

3. The actuator of claim 1;

wherein said structure composed of magnetic material additionally includes a first iron core with a first inner leg portion extending into and partially through said coil and a first outer leg portion extending adjacent and partially along said coil; and wherein said first permanent magnet extends adjacent said first iron core, establishing magnetic flux through said first iron core and across a first portion of said coil between said first inner and first outer leg portions.

4. The actuator of claim 3, wherein said structure composed of magnetic material additionally includes:

a second iron core with a second inner leg portion extending into and partially through said coil and a second outer leg portion extending adjacent and partially along said coil; and a second permanent magnet adjacent said second iron core, establishing magnetic flux through said second iron core and across a second portion of said coil between said second inner and second outer leg portions, wherein said second portion of said coil is diametrically opposite said first portion thereof.

5. An actuator for accurately and selectively positioning a probe into contact with a surface of a device for electrically testing the same, said device being adapted for receipt into an X–Y positioning apparatus, and said actuator being adapted for precise location in a plane parallel to the plane of the device being tested so that said actuator is positioned in superimposed, overlapping relation to the device being tested, comprising in addition:

a frame at least one pair of spaced apart, laterally extending, flexible beams, with each of said beams having an attachment end attached to said frame and a free end opposite said attachment end, at least one of said beams carrying flexible conductors;

an armature attached to said free end of each of said beams thereby being cantilever supported by said beams, said armature being composed of a nonmagnetic material;

a probe including a probe tip attached to said armature, said probe tip adapted for contacting selected points on the surface of said device being tested and electrically connected to conductors in one of said beams carrying flexible conductors;

a coil wound on said armature and arranged so that its axis is in parallel relation to said probe tip; and a structure composed of magnetic material, including a first permanent magnet, attached to said frame, directing a magnetic field from said permanent magnet across a portion of said coil, so that, when electrical current is driven through said coil, said magnetic field causes movement of said armature and said probe with deflection of said flexible beams.

6. The actuator of claim 5;

wherein said structure composed of magnetic material additionally includes a first iron core with a first inner leg portion extending into and partially through said coil and a first outer leg portion extending adjacent and partially along said coil; and wherein said first permanent magnet extends adjacent said first iron core, establishing magnetic flux through said first iron core and across a first portion of said coil between said first inner and first outer leg portions.

7. The actuator of claim 6, wherein said structure composed of magnetic material additionally includes:

a second iron core with a second inner leg portion extending into and partially through said coil and a second outer leg portion extending adjacent and partially along said coil; and a second permanent magnet adjacent said second iron core, establishing magnetic flux through said second iron core and across a second portion of said coil between said second inner and second outer leg portions, wherein said second portion of said coil is diametrically opposite said first portion thereof.

* * * * *